United States Patent
Hirata et al.

(10) Patent No.: US 10,319,593 B2
(45) Date of Patent: Jun. 11, 2019

(54) WAFER THINNING METHOD

(71) Applicant: DISCO CORPORATION, Tokyo (JP)

(72) Inventors: Kazuya Hirata, Tokyo (JP); Yoko Nishino, Tokyo (JP); Hiroshi Morikazu, Tokyo (JP); Karl Priewasser, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 9 days.

(21) Appl. No.: 15/209,292

(22) Filed: Jul. 13, 2016

(65) Prior Publication Data

US 2017/0025275 A1    Jan. 26, 2017

(30) Foreign Application Priority Data

Jul. 21, 2015    (JP) .................................. 2015-144350

(51) Int. Cl.
*H01L 21/04* (2006.01)
*H01L 29/16* (2006.01)
(Continued)

(52) U.S. Cl.
CPC ...... *H01L 21/0475* (2013.01); *B23K 26/0006* (2013.01); *B23K 26/032* (2013.01);
(Continued)

(58) Field of Classification Search
CPC ................ B23K 26/53; B23K 2201/40; B23K 2201/42; H01L 21/7813; H01L 21/78; B28D 5/00; B28D 5/0005; B28D 5/0011
(Continued)

(56) References Cited

U.S. PATENT DOCUMENTS

| 5,223,692 A | 6/1993 | Lozier et al. |
| 5,561,544 A | 10/1996 | Macken |

(Continued)

FOREIGN PATENT DOCUMENTS

| JP | 2000-094221 | 4/2000 |
| JP | 2002-373870 | 12/2002 |

(Continued)

OTHER PUBLICATIONS

Yoshida et al., Dependences of Laser-Induced Bulk Damage Threshold and Crack Patterns in several Nonlinear Crystals on Irradiation Direction, Feb. 8, 2006, Japanese Journal of Applied Physics, vol. 45, No. 2A, pp. 766-769.

(Continued)

*Primary Examiner* — Joseph J Hail
*Assistant Examiner* — J Stephen Taylor
(74) *Attorney, Agent, or Firm* — Greer Burns & Crain, Ltd.

(57) ABSTRACT

Disclosed herein is a wafer thinning method for thinning a wafer formed from an SiC substrate having a first surface and a second surface opposite to the first surface. The wafer thinning method includes an annular groove forming step of forming an annular groove on the second surface of the SiC substrate in an annular area corresponding to the boundary between a device area and a peripheral marginal area in the condition where a thickness corresponding to the finished thickness of the wafer after thinning is left, and a separation start point forming step of applying the laser beam to the second surface as relatively moving a focal point and the SiC substrate to thereby form a modified layer and cracks inside the SiC substrate at the predetermined depth.

4 Claims, 15 Drawing Sheets

(51) Int. Cl.

| | |
|---|---|
| *B23K 26/53* | (2014.01) |
| *B28D 5/00* | (2006.01) |
| *H01L 21/268* | (2006.01) |
| *H01L 21/304* | (2006.01) |
| *H01L 21/683* | (2006.01) |
| *B23K 26/00* | (2014.01) |
| *B23K 26/03* | (2006.01) |
| *B23K 26/08* | (2014.01) |
| *B23K 26/70* | (2014.01) |
| *B23K 26/0622* | (2014.01) |
| *B23K 26/60* | (2014.01) |
| *H01L 21/67* | (2006.01) |
| *B23K 101/40* | (2006.01) |
| *B23K 103/00* | (2006.01) |

(52) U.S. Cl.
CPC ...... *B23K 26/0622* (2015.10); *B23K 26/0823* (2013.01); *B23K 26/0853* (2013.01); *B23K 26/53* (2015.10); *B23K 26/60* (2015.10); *B23K 26/702* (2015.10); *B28D 5/0011* (2013.01); *H01L 21/268* (2013.01); *H01L 21/304* (2013.01); *H01L 21/3043* (2013.01); *H01L 21/6836* (2013.01); *H01L 29/1608* (2013.01); *B23K 2101/40* (2018.08); *B23K 2103/50* (2018.08); *B23K 2103/56* (2018.08); *H01L 21/67092* (2013.01); *H01L 2221/6834* (2013.01); *H01L 2221/68327* (2013.01)

(58) Field of Classification Search
USPC .............................................. 29/25.01–25.03
See application file for complete search history.

(56) References Cited

U.S. PATENT DOCUMENTS

| | | | |
|---|---|---|---|
| 5,581,572 | A | 12/1996 | Delorme et al. |
| 5,912,186 | A | 6/1999 | Yoshino et al. |
| 6,720,522 | B2 | 4/2004 | Ikegami et al. |
| 7,160,790 | B2 * | 1/2007 | Henley ............. B81C 1/0038 |
| | | | 438/455 |
| 7,374,955 | B2 | 5/2008 | Izumome |
| 7,566,635 | B2 | 7/2009 | Fujii et al. |
| 7,737,001 | B2 | 6/2010 | Abe et al. |
| 7,892,949 | B2 | 2/2011 | Abe et al. |
| 8,148,184 | B2 | 4/2012 | Koyanagi et al. |
| 8,263,479 | B2 | 9/2012 | Fukuyo et al. |
| 8,415,234 | B2 | 4/2013 | Abatake |
| 8,722,516 | B2 | 5/2014 | Yamada et al. |
| 8,790,997 | B2 | 7/2014 | Nakagawa et al. |
| 9,138,913 | B2 | 9/2015 | Arai et al. |
| 9,174,305 | B2 | 11/2015 | Morikazu et al. |
| 9,193,008 | B2 | 11/2015 | Morikazu et al. |
| 9,478,696 | B2 | 10/2016 | Tajikara et al. |
| 9,481,051 | B2 | 11/2016 | Hirata et al. |
| 9,488,831 | B2 | 11/2016 | Ito et al. |
| 9,517,530 | B2 | 12/2016 | Hirata et al. |
| 9,620,415 | B2 | 4/2017 | Hirata et al. |
| 9,757,815 | B2 | 9/2017 | Hosseini |
| 9,789,565 | B2 | 10/2017 | Hirata et al. |
| 9,850,160 | B2 | 12/2017 | Marjanovic et al. |
| 9,878,397 | B2 | 1/2018 | Hirata et al. |
| 2003/0141505 | A1 | 7/2003 | Isobe et al. |
| 2004/0002199 | A1 | 1/2004 | Fukuyo et al. |
| 2004/0144301 | A1 | 7/2004 | Neudeck et al. |
| 2005/0199592 | A1 | 9/2005 | Iri et al. |
| 2005/0217560 | A1 | 10/2005 | Tolchinsky et al. |
| 2006/0008941 | A1 | 1/2006 | Haskell et al. |
| 2006/0079155 | A1 * | 4/2006 | Nakamura ............ B24B 7/228 |
| | | | 451/41 |
| 2006/0148210 | A1 | 7/2006 | Furuta et al. |
| 2006/0258047 | A1 | 11/2006 | Nishiwaki et al. |
| 2007/0111480 | A1 | 5/2007 | Maruyama et al. |
| 2007/0284764 | A1 * | 12/2007 | Sekiya ................. H01L 21/681 |
| | | | 257/797 |
| 2008/0008641 | A1 | 1/2008 | Leonard et al. |
| 2008/0062430 | A1 | 3/2008 | Horvath et al. |
| 2008/0070380 | A1 | 3/2008 | Kusunoki |
| 2009/0056513 | A1 | 3/2009 | Baer |
| 2009/0117712 | A1 | 5/2009 | Sakamoto et al. |
| 2009/0127233 | A1 | 5/2009 | Asano et al. |
| 2009/0320897 | A1 | 12/2009 | Shimomura |
| 2010/0203706 | A1 * | 8/2010 | Ohnuma ........... H01L 21/76254 |
| | | | 438/458 |
| 2011/0193269 | A1 | 8/2011 | Ito et al. |
| 2011/0195536 | A1 | 8/2011 | Koyanagi et al. |
| 2011/0195537 | A1 | 8/2011 | Koyanagi et al. |
| 2011/0298084 | A1 | 12/2011 | Tamemoto |
| 2012/0055546 | A1 | 3/2012 | Turner |
| 2012/0111495 | A1 | 5/2012 | Shimoi et al. |
| 2012/0289028 | A1 | 11/2012 | Abatake |
| 2012/0298636 | A1 | 11/2012 | Nomaru et al. |
| 2013/0037825 | A1 | 2/2013 | Hiraiwa et al. |
| 2013/0171402 | A1 | 7/2013 | Straubinger et al. |
| 2013/0248500 | A1 * | 9/2013 | Shreter ............. B23K 26/0057 |
| | | | 219/121.67 |
| 2014/0001679 | A1 | 1/2014 | Okuma et al. |
| 2014/0038392 | A1 * | 2/2014 | Yonehara ............. H01L 21/304 |
| | | | 438/463 |
| 2015/0038062 | A1 * | 2/2015 | Umeda ............ H01L 21/67219 |
| | | | 451/70 |
| 2015/0121960 | A1 | 5/2015 | Hosseini |
| 2015/0376813 | A1 | 12/2015 | Tsuchida et al. |
| 2016/0052090 | A1 | 2/2016 | Tanigawa |
| 2016/0093763 | A1 | 3/2016 | Rana et al. |
| 2016/0121426 | A1 | 5/2016 | Hollinger et al. |
| 2016/0158881 | A1 | 6/2016 | Hirata et al. |
| 2016/0163549 | A1 | 6/2016 | Okuma et al. |
| 2016/0228984 | A1 | 8/2016 | Hirata et al. |
| 2016/0293397 | A1 | 10/2016 | Hirata et al. |
| 2016/0354862 | A1 | 12/2016 | Hirata et al. |
| 2016/0354863 | A1 | 12/2016 | Hirata |
| 2017/0015017 | A1 | 1/2017 | Hirata |
| 2017/0053829 | A1 | 2/2017 | Hirata et al. |
| 2017/0250113 | A1 | 8/2017 | Vanagas et al. |
| 2017/0355041 | A1 * | 12/2017 | Yamashita ............... B28D 5/00 |

FOREIGN PATENT DOCUMENTS

| | | |
|---|---|---|
| JP | 2007-019379 | 1/2007 |
| JP | 2013-049161 | 3/2013 |

OTHER PUBLICATIONS

Hirata et al., U.S. Appl. No. 14/955,352, filed Dec. 1, 2015.
Hirata et al., U.S. Appl. No. 14/955,306, filed Dec. 1, 2015.
Hirata, et al., U.S. Appl. No. 14/953,718, filed Nov. 30, 2015.
Hirata et al., U.S. Appl. No. 14/953,679, filed Nov. 30, 2015.
Hirata et al., U.S. Appl. No. 14/988,310, filed Jan. 5, 2016.
Hirata et al., U.S. Appl. No. 14/988,378, filed Jan. 5, 2016.
Hirata et al., U.S. Appl. No. 15/015,852, filed Feb. 4, 2016.
Hirata et al., U.S. Appl. No. 15/014,367, filed Feb. 3, 2016.
Hirata et al., U.S. Appl. No. 15/015,532, filed Feb. 4, 2016.
Hirata et al., U.S. Appl. No. 15/088,386, filed Apr. 1, 2016.
Hirata et al., U.S. Appl. No. 15/083,635, filed Mar. 29, 2016.
Hirata et al., U.S. Appl. No. 15/088,441, filed Apr. 1, 2016.
Hirata, Kazuya, U.S. Appl. No. 15/165,686, filed May 26, 2016.
Hirata, Kazuya, U.S. Appl. No. 15/165,259, filed May 26, 2016.
Hirata, Kazuya, U.S. Appl. No. 15/205,644, filed Jul. 8, 2016.
Hirata, Kazuya, U.S. Appl. No. 15/212,513, filed Jul. 18, 2016.

* cited by examiner

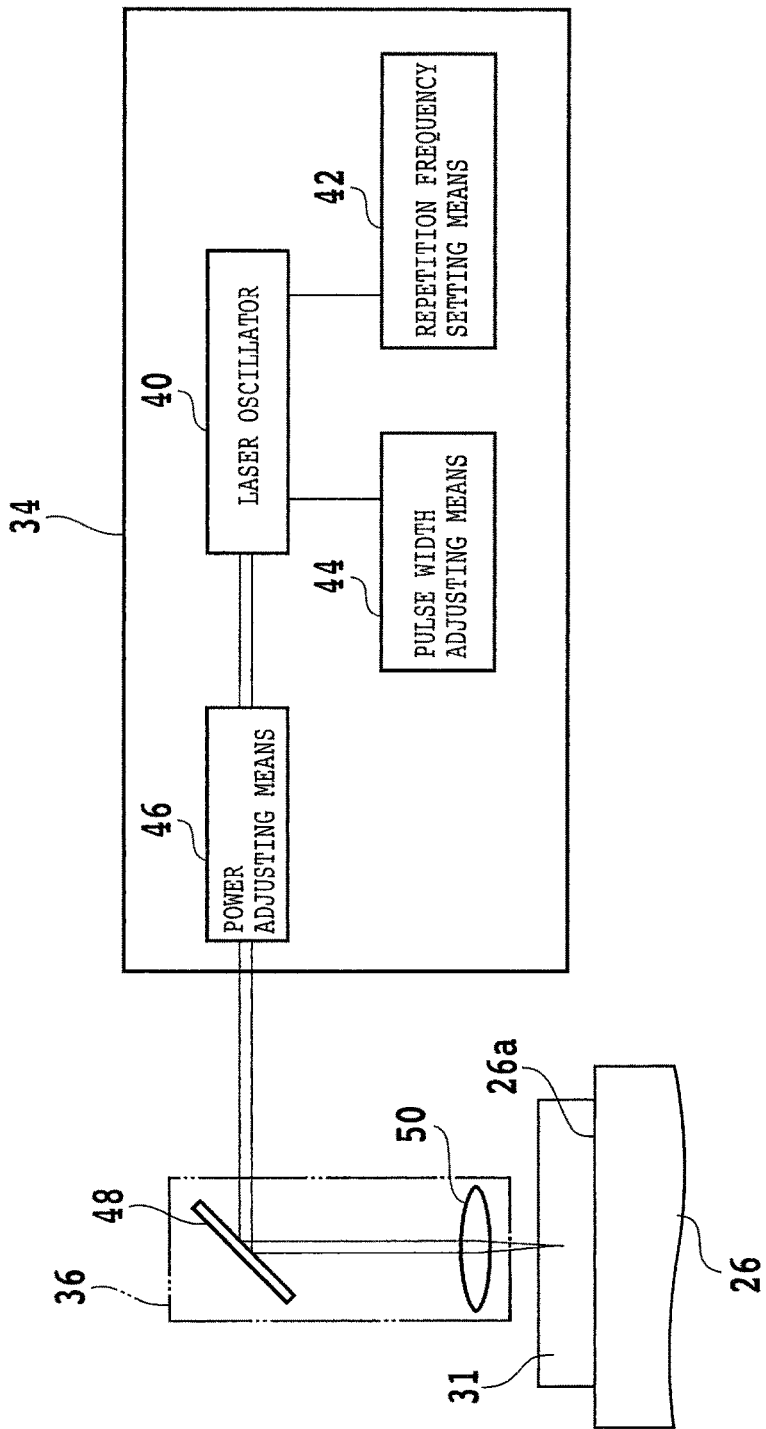

FIG.10
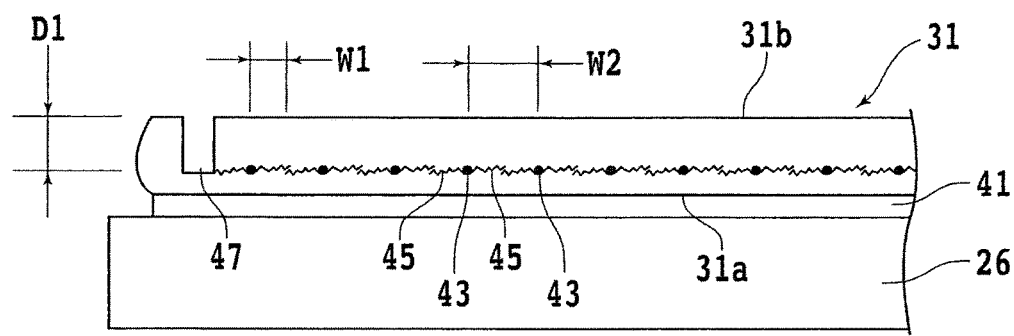
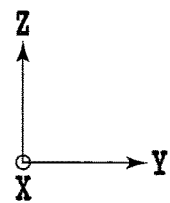

FIG.11
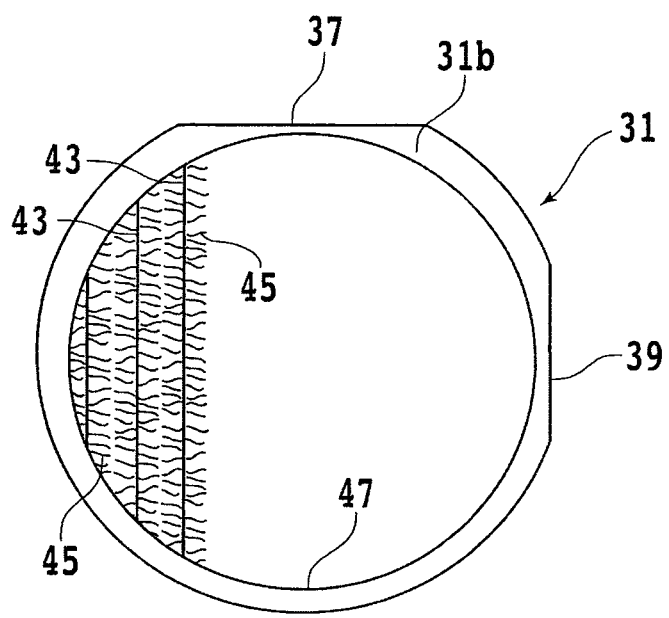
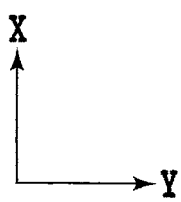

WAFER THINNING METHOD

BACKGROUND OF THE INVENTION

Field of the Invention

The present invention relates to a wafer thinning method for thinning a wafer composed of an SiC substrate and a plurality of devices formed on the front side of the SiC substrate.

Description of the Related Art

Various devices such as integrated circuits (ICs) and large-scale integrations (LSIs) are formed by forming a functional layer on the front side of a wafer formed from a silicon substrate and partitioning this functional layer into a plurality of regions along a plurality of crossing division lines. The back side of the wafer is ground by a grinding apparatus to thereby reduce the thickness of the wafer to a predetermined thickness. Thereafter, the division lines of the wafer are processed by a processing apparatus such as a cutting apparatus and a laser processing apparatus to thereby divide the wafer into a plurality of individual device chips corresponding to the devices. The device chips thus obtained are widely used in various electronic equipment such as mobile phones and personal computers.

Further, power devices or optical devices such as light-emitting diodes (LEDs) and laser diodes (LDs) are formed by forming a functional layer on the front side of a wafer formed from an SiC substrate and partitioning this functional layer into a plurality of regions along a plurality of crossing division lines. As similarly to the case of the silicon wafer mentioned above, the back side of the SiC wafer is ground by a grinding apparatus to thereby reduce the thickness of the SiC wafer to a predetermined thickness. Thereafter, the division lines of the SiC wafer are processed by a processing apparatus such as a cutting apparatus and a laser processing apparatus to thereby divide the SiC wafer into a plurality of individual device chips corresponding to the power devices or the optical devices. The device chips thus obtained are widely used in various electronic equipment.

As described above, the back side of the SiC wafer is ground to thin the SiC wafer to a predetermined thickness before cutting the SiC wafer along the division lines as in the case of the silicon wafer. To achieve a recent reduction in weight and size of electronic equipment, it has been required to further reduce the thickness of a wafer to a thickness of approximately 50 μm, for example. However, such a wafer thinned by grinding is hard to handle and there is accordingly a possibility of damage to the wafer during transfer or the like. The front side of the wafer has a device area where the devices are formed and a peripheral marginal area surrounding the device area. To solve the above problem, there has been proposed a grinding method of grinding the back side of the wafer in only a central area corresponding to the device area, thereby forming a circular recess on the back side of the wafer in this central area, whereby a ring-shaped reinforcing portion is formed on the back side of the wafer in a peripheral area corresponding to the peripheral marginal area (see Japanese Patent Laid-Open No. 2007-19379).

SUMMARY OF THE INVENTION

However, an SiC substrate has Mohs hardness much higher than that of a silicon substrate. Accordingly, in grinding the back side of a wafer formed from an SiC substrate by using a grinding wheel having abrasive members, there is a problem such that the abrasive members may wear in an amount of approximately 4 times to 5 times the grinding amount of the wafer, causing very poor economy. For example, when the grinding amount of a silicon substrate is 100 μm, the wear amount of the abrasive members becomes 0.1 μm. In contrast, when the grinding amount of an SiC substrate is 100 μm, the wear amount of the abrasive members becomes 400 μm to 500 μm. Accordingly, the wear amount of the abrasive members in grinding an SiC substrate is 4000 times to 5000 times that in grinding a silicon substrate.

It is therefore an object of the present invention to provide a wafer thinning method which can thin a wafer formed from an SiC substrate to a predetermined thickness without grinding the back side of the wafer, wherein a plurality of devices are previously formed on the front side of the SiC substrate.

In accordance with an aspect of the present invention, there is provided a wafer thinning method for thinning a wafer formed from an SiC substrate having a first surface, a second surface opposite to the first surface, a c-axis extending from the first surface to the second surface, and a c-plane perpendicular to the c-axis, the first surface of the SiC substrate having a device area where a plurality of devices are formed and a peripheral marginal area surrounding the device area. The wafer thinning method includes an annular groove forming step of forming an annular groove on the second surface of the SiC substrate in an annular area corresponding to the boundary between the device area and the peripheral marginal area in the condition where a thickness corresponding to the finished thickness of the wafer after thinning is left. The wafer thinning method further includes a separation start point forming step of setting the focal point of a laser beam having a transmission wavelength to the SiC substrate inside the SiC substrate in a central area surrounded by the annular groove at a predetermined depth from the second surface, which depth corresponds to the finished thickness of the wafer after thinning, and next applying the laser beam to the second surface as relatively moving the focal point and the SiC substrate to thereby form a modified layer inside the SiC substrate at the predetermined depth in the central area and also form cracks extending from the modified layer along the c-plane, thus forming a separation start point. The wafer thinning method further includes a wafer thinning step of applying an external force to the wafer after performing the separation start point forming step, thereby separating the wafer into a first wafer having the first surface of the SiC substrate and a second wafer having the second surface of the SiC substrate at the separation start point, whereby the thickness of the wafer is reduced to the finished thickness of the wafer after thinning as the thickness of the first wafer having the first surface of the SiC substrate, and a ring-shaped reinforcing portion is formed on a back side of the first wafer in a peripheral area corresponding to the peripheral marginal area. The separation start point forming step includes a modified layer forming step of relatively moving the focal point of the laser beam in a first direction perpendicular to a second direction where the c-axis is inclined by an off angle with respect to a normal to the second surface and the off angle is formed between the second surface and the c-plane, thereby linearly forming the modified layer extending in the first direction, and an indexing step of relatively moving the focal point in the second direction to thereby index the focal point by a predetermined amount.

Preferably, the wafer thinning method further includes a grinding step of grinding the back side of the first wafer having the first surface except the ring-shaped reinforcing portion after performing the wafer thinning step, thereby flattening the back side of the first wafer except said ring-shaped reinforcing portion.

According to the wafer thinning method of the present invention, the modified layers and the cracks are formed inside the wafer in the central area surrounded by the annular groove. Thereafter, an external force is applied to the wafer to thereby separate the wafer into two wafers, that is, the first wafer and the second wafer at the separation start point (along a separation plane) composed of the modified layers and the cracks. Accordingly, the thickness of the wafer can be easily reduced to the finished thickness of the wafer after thinning as the thickness of the first wafer having the first surface on which the plural devices are formed. Accordingly, the wafer formed from the SiC substrate can be thinned without grinding the back side of the wafer by using abrasive members, so that the problem of uneconomical wearing of the abrasive members can be solved. Furthermore, the first wafer having the first surface has the ring-shaped reinforcing portion on the back side of the first wafer along the outer circumference thereof, so that damage to the first wafer can be suppressed by this reinforcing portion.

In the case of grinding and flattening the back side of the first wafer obtained by the wafer thinning step mentioned above, it is only necessary to slightly grind the back side of the first wafer by an amount of approximately 1 µm to 5 µm, so that the wear amount of the abrasive members can be suppressed to approximately 4 µm to 25 µm. In addition, the second wafer separated from the first wafer can be reused as an SiC substrate, thereby achieving great economy.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 2 is a block diagram of a laser beam generating unit;

FIG. 10 is a schematic sectional view for illustrating a modified layer forming step;

FIG. 11 is a schematic plan view for illustrating the modified layer forming step;

DETAILED DESCRIPTION OF THE PREFERRED EMBODIMENT

Figure 1:
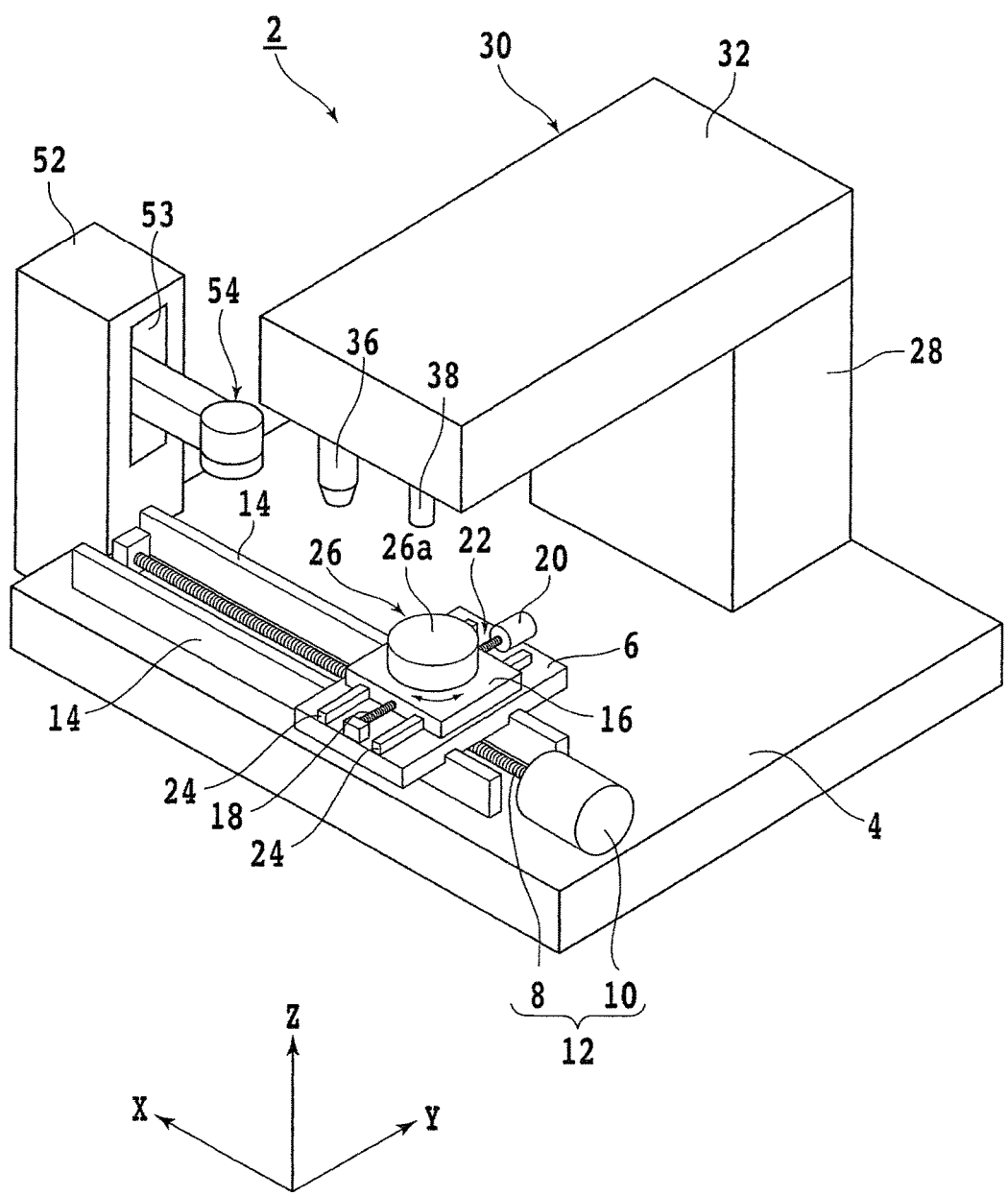
FIG. 1 is a perspective view of a laser processing apparatus suitable for use in performing a wafer thinning method of the present invention.

A preferred embodiment of the present invention will now be described in detail with reference to the drawings. Referring to FIG. 1, there is shown a perspective view of a laser processing apparatus 2 suitable for use in performing a wafer thinning method of the present invention. The laser processing apparatus 2 includes a stationary base 4 and a first slide block 6 mounted on the stationary base 4 so as to be movable in the X direction. The first slide block 6 is moved in a feeding direction, or in the X direction along a pair of guide rails 14 by a feeding mechanism 12 composed of a ball screw 8 and a pulse motor 10.

A second slide block 16 is mounted on the first slide block 6 so as to be movable in the Y direction. The second slide block 16 is moved in an indexing direction, or in the Y direction along a pair of guide rails 24 by an indexing mechanism 22 composed of a ball screw 18 and a pulse motor 20. A chuck table 26 having a suction holding portion 26a is mounted on the second slide block 16. The chuck table 26 is movable in the X direction and the Y direction by the feeding mechanism 12 and the indexing mechanism 22 and also rotatable by a motor stored in the second slide block 16.

A column 28 is provided on the stationary base 4 so as to project upward therefrom. A laser beam applying mechanism (laser beam applying means) 30 is mounted on the column 28. The laser beam applying mechanism 30 is composed of a casing 32, a laser beam generating unit 34 (see FIG. 2) stored in the casing 32, and focusing means (laser head) 36 mounted on the front end of the casing 32. An imaging unit 38 having a microscope and a camera is also mounted on the front end of the casing 32 so as to be aligned with the focusing means 36 in the X direction.

As shown in FIG. 2, the laser beam generating unit 34 includes a laser oscillator 40 such as YAG laser and YVO4 laser for generating a pulsed laser beam, repetition frequency setting means 42 for setting the repetition frequency of the pulsed laser beam to be generated by the laser oscillator 40, pulse width adjusting means 44 for adjusting the pulse width of the pulsed laser beam to be generated by the laser oscillator 40, and power adjusting means 46 for adjusting the power of the pulsed laser beam generated by the laser oscillator 40. Although especially not shown, the laser oscillator 40 has a Brewster window, so that the laser beam generated from the laser oscillator 40 is a laser beam of linearly polarized light. After the power of the pulsed laser beam is adjusted to a predetermined power by the power adjusting means 46 of the laser beam generating unit 34, the pulsed laser beam is reflected by a mirror 48 included in the focusing means 36 and next focused by a focusing lens 50 included in the focusing means 36. The focusing lens 50 is positioned so that the pulsed laser beam is focused inside an SiC wafer 31 (to be hereinafter described) as a workpiece held on the suction holding portion 26a of the chuck table 26.

Figure 3A:
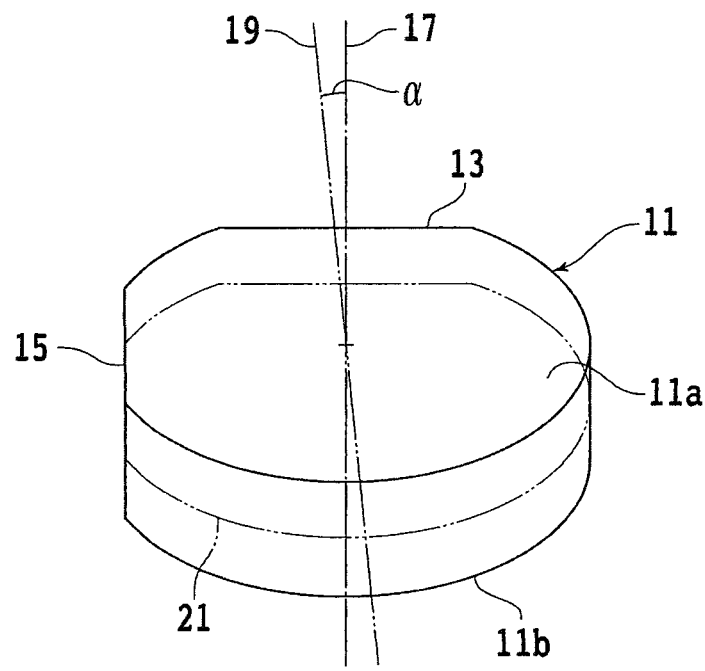
FIG. 3A is a perspective view of an SiC ingot.
Figure 3B:
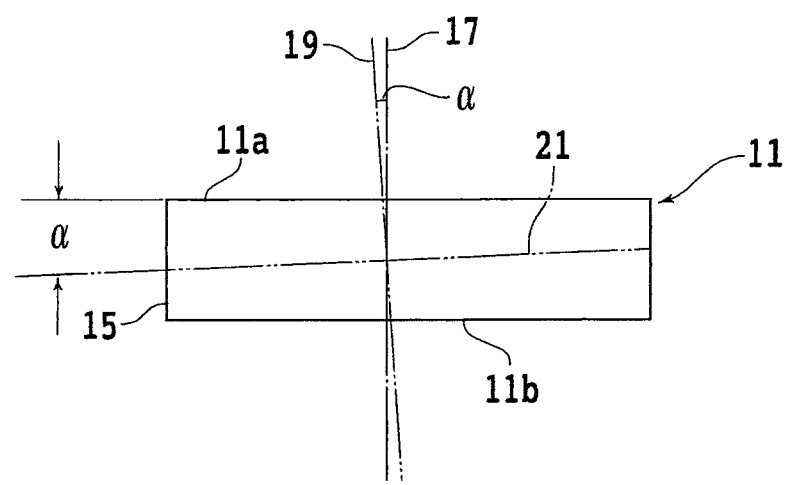
FIG. 3B is an elevational view of the SiC ingot shown in FIG. 3A.

Referring to FIG. 3A, there is shown a perspective view of an SiC ingot (which will be hereinafter referred to also simply as ingot) 11. FIG. 3B is an elevational view of the SiC ingot 11 shown in FIG. 3A. The ingot 11 has a first surface (upper surface) 11a and a second surface (lower surface) 11b opposite to the first surface 11a. The first surface 11a of the ingot 11 is preliminarily polished to a mirror finish because the laser beam is applied to the first surface 11a.

The ingot 11 has a first orientation flat 13 and a second orientation flat 15 perpendicular to the first orientation flat 13. The length of the first orientation flat 13 is set longer than the length of the second orientation flat 15. The ingot 11 has a c-axis 19 inclined by an off angle α toward the second orientation flat 15 with respect to a normal 17 to the upper surface 11a and also has a c-plane 21 perpendicular to the c-axis 19. The c-plane 21 is inclined by the off angle α with respect to the upper surface 11a of the ingot 11. In general, in a hexagonal single crystal ingot including the SiC ingot 11, the direction perpendicular to the direction of extension of the shorter second orientation flat 15 is the direction of inclination of the c-axis 19. The c-plane 21 is set in the ingot 11 innumerably at the molecular level of the ingot 11. In the preferred embodiment, the off angle α is set to 4 degrees. However, the off angle α is not limited to 4 degrees in the present invention. For example, the off angle α may be freely set in the range of 1 degree to 6 degrees in manufacturing the ingot 11.

Referring again to FIG. 1, a column 52 is fixed to the left side of the stationary base 4. The column 52 is formed with a vertically elongated opening 53, and a pressing mechanism 54 is vertically movably mounted to the column 52 so as to project from the opening 53.

Figure 4:
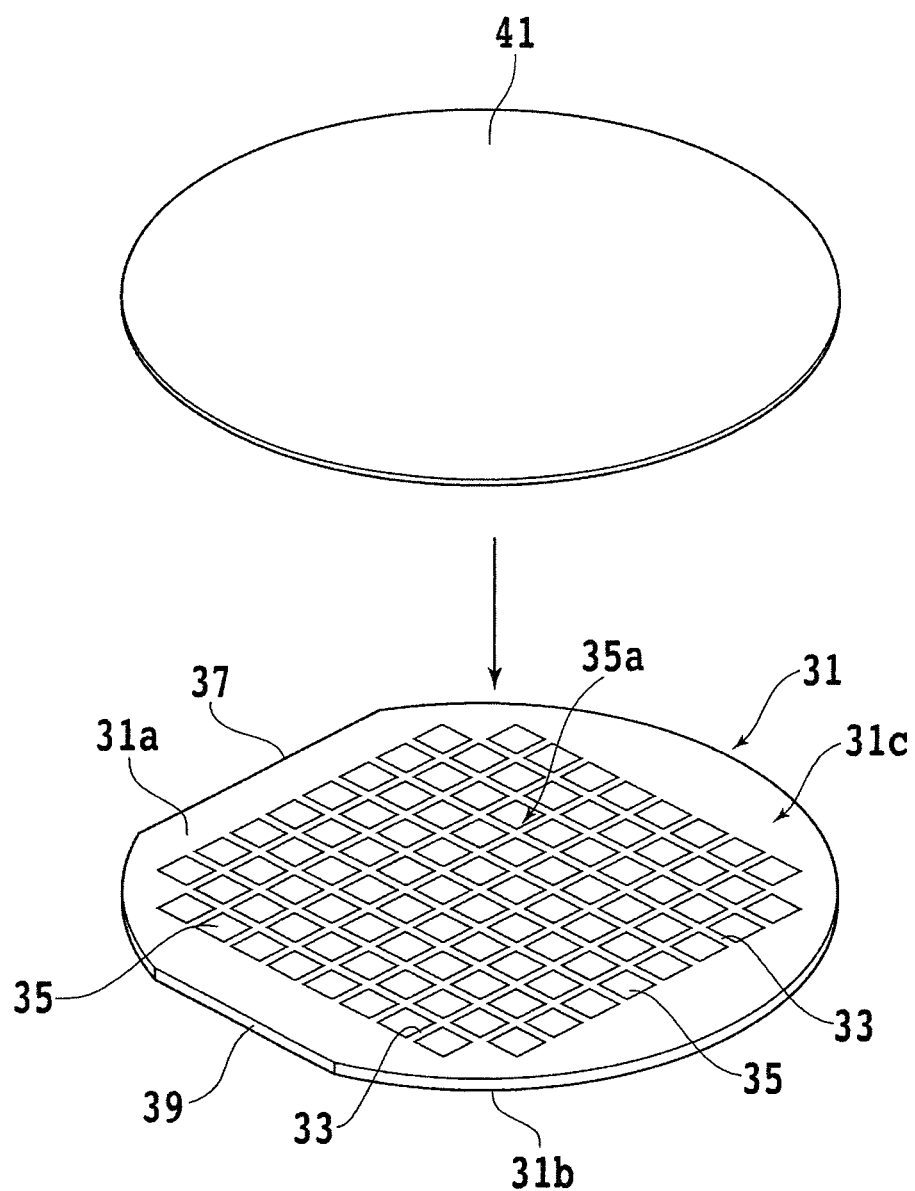
FIG. 4 is a perspective view showing a step of attaching a protective tape to the front side of an SiC wafer having a plurality of devices on the front side.

Referring to FIG. 4, there is shown a perspective view of an SiC wafer 31 (SiC substrate) having a front side 31a (first surface) and a back side 31b (second surface). FIG. 4 shows a step of attaching a protective tape 41 to the front side 31a of the SiC wafer 31. The SiC wafer (which will be hereinafter referred to also simply as wafer) 31 is obtained by slicing the SiC ingot 11 shown in FIGS. 3A and 3B with a wire saw. For example, the SiC wafer 31 has a thickness of approximately 700 μm. After polishing the front side 31a of the wafer 31 to a mirror finish, a plurality of devices 35 such as power devices are formed on the front side 31a of the wafer 31 by photolithography. A plurality of crossing division lines 33 are formed on the front side 31a of the wafer 31 to thereby define a plurality of separate regions where the plural devices 35 are individually formed. The front side 31a of the wafer 31 has a device area 35a where the plural devices 35 are formed and a peripheral marginal area 31c surrounding the device area 35a.

The SiC wafer 31 has a first orientation flat 37 and a second orientation flat 39 perpendicular to the first orientation flat 37. The length of the first orientation flat 37 is set longer than the length of the second orientation flat 39. Since the SiC wafer 31 is obtained by slicing the SiC ingot 11 shown in FIGS. 3A and 3B with a wire saw, the first orientation flat 37 corresponds to the first orientation flat 13 of the ingot 11, and the second orientation flat 39 corresponds to the second orientation flat 15 of the ingot 11.

The wafer 31 has a c-axis 19 inclined by an off angle α toward the second orientation flat 39 with respect to a normal 17 to the front side 31a and also has a c-plane 21 perpendicular to the c-axis 19 (see FIGS. 3A and 3B). The c-plane 21 is inclined by the off angle α with respect to the front side 31a of the wafer 31. In the SiC wafer 31, the direction perpendicular to the direction of extension of the shorter second orientation flat 39 is the direction of inclination of the c-axis 19.

Figure 5A:
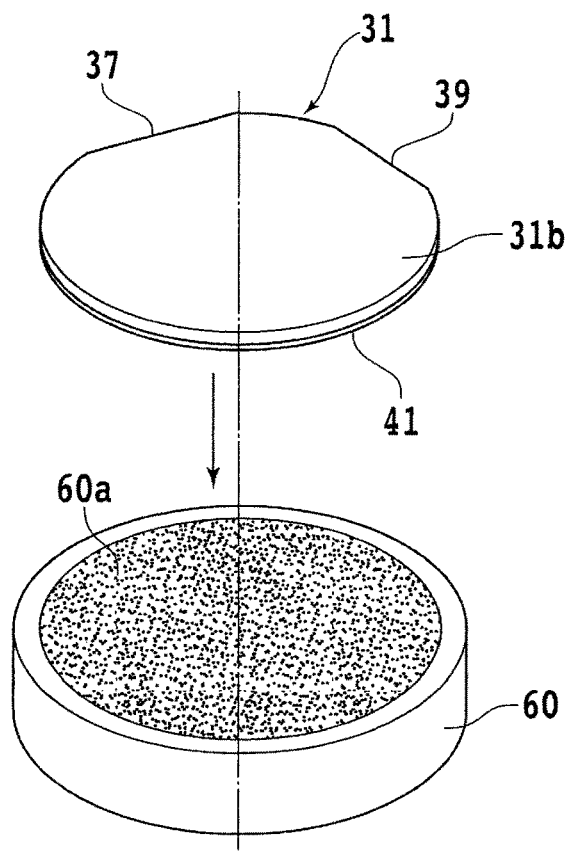
FIG. 5A is a perspective view showing a step of placing the wafer shown in FIG. 4 through the protective tape on a chuck table.
Figure 5B:
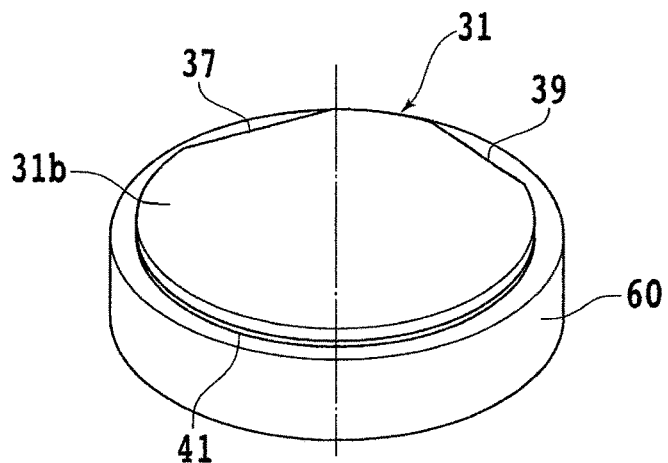
FIG. 5B is a perspective view showing a condition where the wafer shown in FIG. 5A is held on the chuck table under suction.

After attaching the protective tape 41 to the front side 31a of the wafer 31, the wafer 31 is placed on a chuck table 60 included in a cutting apparatus (not shown) in the condition where the protective tape 41 is oriented downward as shown in FIG. 5A. The chuck table 60 has a suction holding portion 60a for holding the wafer 31 under suction. The wafer 31 is placed on the chuck table 60 in the condition where the protective tape 41 is in contact with the suction holding portion 60a of the chuck table 60. In this condition, a vacuum is applied to the suction holding portion 60a of the chuck table 60, thereby holding the wafer 31 through the protective tape 41 on the chuck table 60 under suction in the condition where the back side 31b of the wafer 31 is exposed upward as shown in FIG. 5B.

Figure 6:
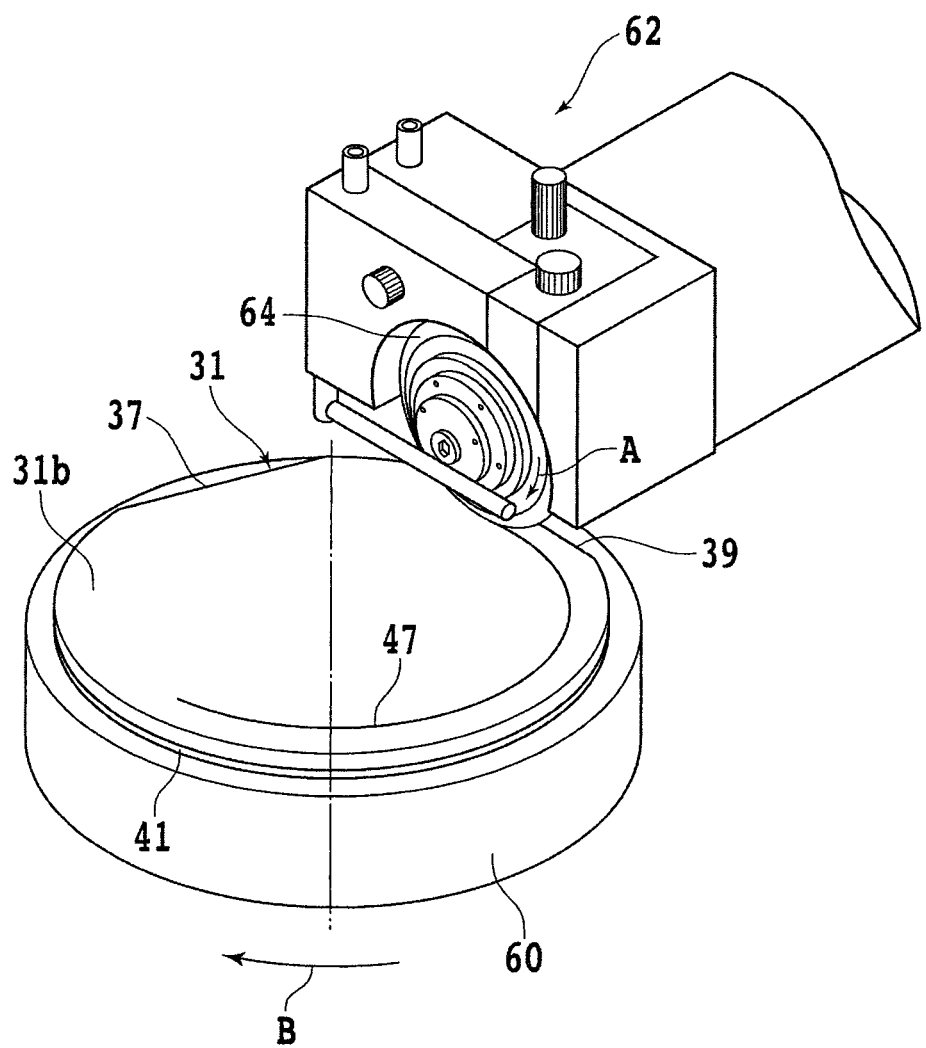
FIG. 6 is a perspective view showing an annular groove forming step.
Figure 7A:
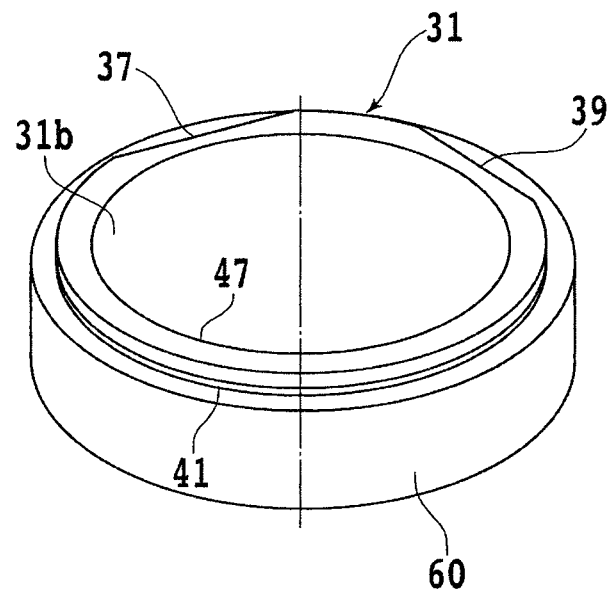
FIG. 7A is a perspective view showing a condition where an annular groove has been formed on the back side of the wafer by performing the annular groove forming step.
Figure 7B:
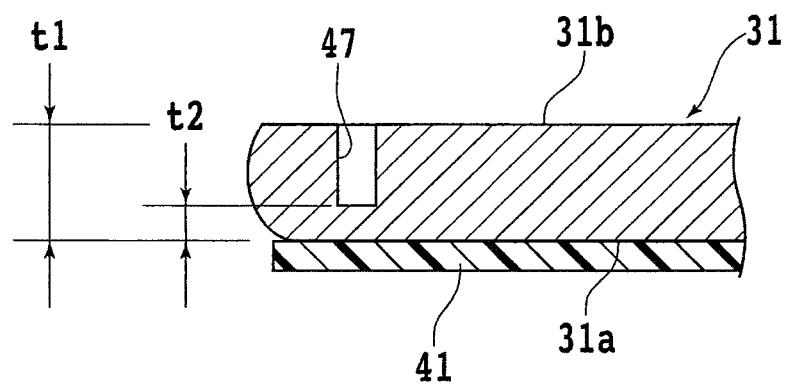
FIG. 7B is a sectional view of an essential part of the wafer including the annular groove shown in FIG. 7A.

Thereafter, as shown in FIG. 6, the back side 31b of the wafer 31 held on the chuck table 60 is cut in an annular area corresponding to the boundary between the device area 35a and the peripheral marginal area 31c of the wafer 31 by using a cutting blade 64 of a cutting unit 62 included in the cutting apparatus. More specifically, the cutting blade 64 is rotated at a high speed in the direction shown by an arrow A in FIG. 6, and at the same time the chuck table 60 is slowly rotated in the direction shown by an arrow B in FIG. 6. The cutting blade 64 being rotated is lowered to cut in the back side 31b of the wafer 31 held on the chuck table 60 being rotated, so that an annular groove 47 is formed on the back side 31b of the wafer 31 as shown in FIG. 7A in the condition where a thickness corresponding to the finished thickness of the wafer 31 after thinning is left (annular groove forming step). As shown in FIG. 7B which is a sectional view of an essential part of the wafer 31 shown in FIG. 7A, the thickness t1 of the wafer 31 is 700 μm, and the finished thickness t2 of the wafer 31 after thinning is 50 μm, so that the depth of the annular groove 47 is 650 μm.

Figure 8:
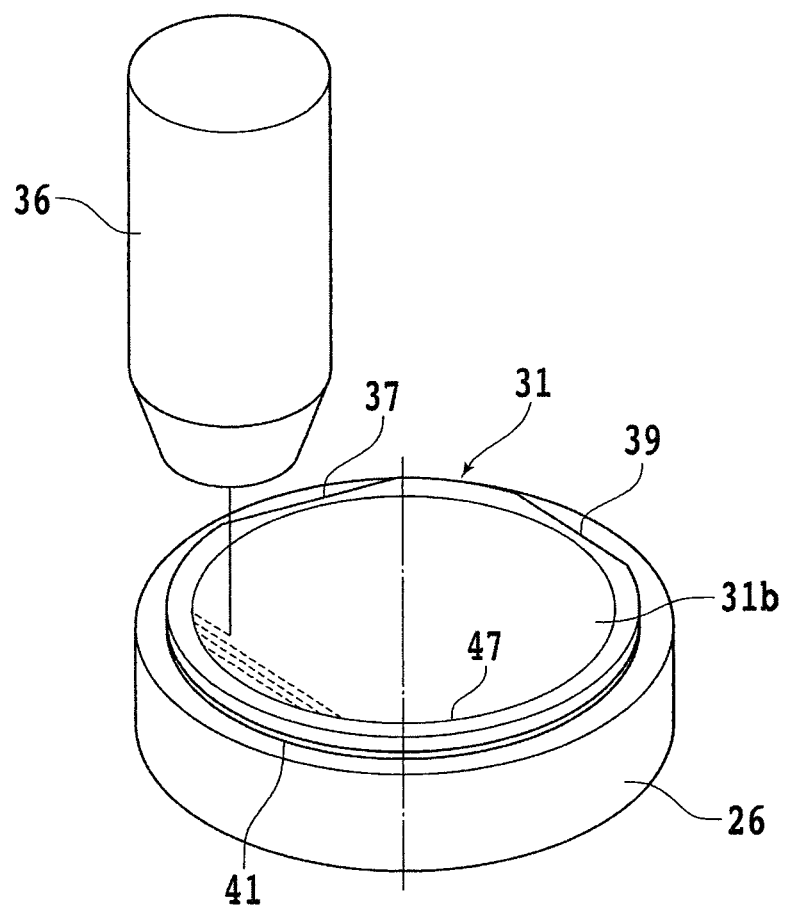
FIG. 8 is a perspective view for illustrating a separation start point forming step.
Figure 9:
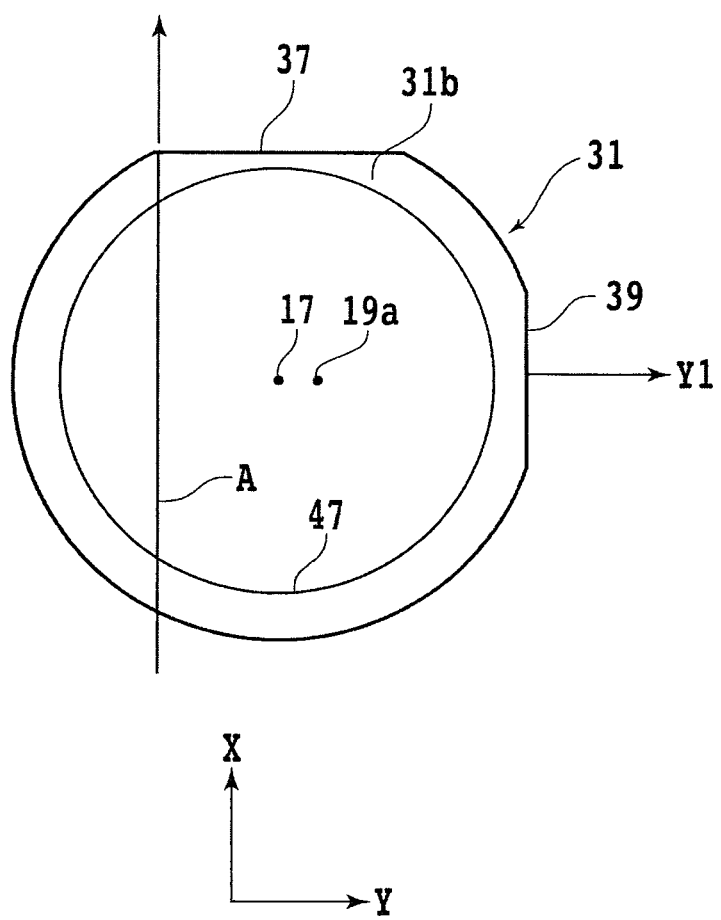
FIG. 9 is a plan view of the wafer shown in FIG. 8 as viewed from the back side of the wafer.

After performing the annular groove forming step, the wafer 31 is held under suction on the chuck table 26 of the laser processing apparatus 2, and the chuck table 26 holding the wafer 31 is rotated so that the second orientation flat 39 of the wafer 31 becomes parallel to the X direction as shown in FIGS. 8 and 9. In other words, as shown in FIG. 9, the direction of formation of the off angle α is shown by an arrow Y1. That is, the direction of the arrow Y1 is the direction where an intersection 19a between the c-axis 19 and the back side 31b is present with respect to the normal 17 to the back side 31b of the wafer 31. Further, the direction perpendicular to the direction of the arrow Y1 is shown by an arrow A. Then, the chuck table 26 holding the wafer 31 is rotated so that the direction of the arrow A becomes parallel to the X direction, that is, the direction of the arrow A parallel to the second orientation flat 39 coincides with the X direction. Accordingly, the laser beam is scanned in the direction of the arrow A perpendicular to the direction of the arrow Y1, or the direction of formation of the off angle α. In other words, the direction of the arrow A perpendicular to the direction of the arrow Y1 where the off angle α is formed is defined as the feeding direction of the chuck table 26.

In the wafer thinning method of the present invention, it is important that the scanning direction of the laser beam to be applied from the focusing means 36 is set to the direction of the arrow A perpendicular to the direction of the arrow Y1 where the off angle α of the wafer 31 is formed. That is, it was found that by setting the scanning direction of the laser beam to the direction of the arrow A as mentioned above in the wafer thinning method of the present invention, cracks propagating from a modified layer formed inside the wafer 31 by the laser beam extend very long along the c-plane 21.

In performing the wafer thinning method according to the preferred embodiment, a separation start point forming step is performed in such a manner that the focal point of the laser beam having a transmission wavelength (e.g., 1064 nm) to the wafer 31 (SiC substrate) held on the chuck table 26 is set inside the wafer 31 in a central area surrounded by the annular groove 47 at a predetermined depth from the back side 31b (second surface), which depth corresponds to the finished thickness of the wafer 31 after thinning, and the laser beam is applied to the back side 31b as relatively moving the focal point and the wafer 31 to thereby form a modified layer 43 parallel to the front side 31a and cracks 45 propagating from the modified layer 43 along the c-plane 21, thus forming a separation start point (see FIG. 10).

This separation start point forming step includes a modified layer forming step of relatively moving the focal point of the laser beam in the direction of the arrow A perpendicular to the direction of the arrow Y1 where the c-axis 19 is inclined by the off angle α with respect to the normal 17 to the back side 31b and the off angle α is formed between the c-plane 21 and the back side 31b as shown in FIG. 9, thereby forming the modified layer 43 inside the wafer 31 in a central area surrounded by the annular groove 47 and also forming the cracks 45 propagating from the modified layer 43 along the c-plane 21, and also includes an indexing step of relatively moving the focal point in the direction of formation of the off angle α, i.e., in the Y direction to thereby index the focal point by a predetermined amount as shown in FIGS. 10 and 11.

As shown in FIGS. 10 and 11, the modified layer 43 is linearly formed so as to extend in the X direction, so that the cracks 45 propagate from the modified layer 43 in opposite directions along the c-plane 21. In the wafer thinning method according to the preferred embodiment, the separation start point forming step further includes an index amount setting step of measuring the width of the cracks 45 formed on one side of the modified layer 43 along the c-plane 21 and then setting the index amount of the focal point according to the width measured above. More specifically, letting W1 denote the width of the cracks 45 formed on one side of the modified layer 43 so as to propagate from the modified layer 43 along the c-plane 21, an index amount W2 of the focal point is set in the range of W1 to 2W1.

For example, the separation start point forming step is performed under the following laser processing conditions.
  Light source: Nd:YAG pulsed laser
  Wavelength: 1064 nm
  Repetition frequency: 80 kHz
  Average power: 3.2 W
  Pulse width: 4 ns
  Spot diameter: 10 μm
  Numerical aperture (NA) of focusing lens: 0.45
  Index amount: 400 μm In the laser processing conditions mentioned above, the width W1 of the cracks 45 propagating from the modified layer 43 along the c-plane 21 in one direction as viewed in FIG. 10 is set to approximately 250 μm, and the index amount W2 is set to 400 μm. However, the average power of the laser beam is not limited to 3.2 W. When the average power of the laser beam was set to 2 W to 4.5 W, good results were obtained in the preferred embodiment. In the case that the average power was set to 2 W, the width W1 of the cracks 45 was approximately 100 μm. In the case that the average power was set to 4.5 W, the width W1 of the cracks 45 was approximately 350 μm.

In the case that the average power is less than 2 W or greater than 4.5 W, the modified layer 43 cannot be well formed inside the wafer 31. Accordingly, the average power of the laser beam to be applied is preferably set in the range of 2 W to 4.5 W. For example, the average power of the laser beam to be applied to the wafer 31 was set to 3.2 W in the preferred embodiment. As shown in FIG. 10, the depth D1 of the focal point from the back side 31b in forming the modified layer 43 was set to 650 μm.

In this manner, the focal point of the laser beam is sequentially indexed to form a plurality of modified layers 43 at the depth D1 from the back side 31b of the wafer 31 in the central area surrounded by the annular groove 47 and also to form the cracks 45 extending from each modified layer 43 along the c-plane 21 as shown in FIG. 11. Thereafter, a wafer thinning step is performed in such a manner that an external force is applied to the wafer 31 to thereby separate the wafer 31 into two wafers at the separation start point composed of the modified layers 43 and the cracks 45, thus reducing the thickness of the wafer 31 (having a plural devices 35) to a finished thickness of approximately 50 μm.

Figure 12A:
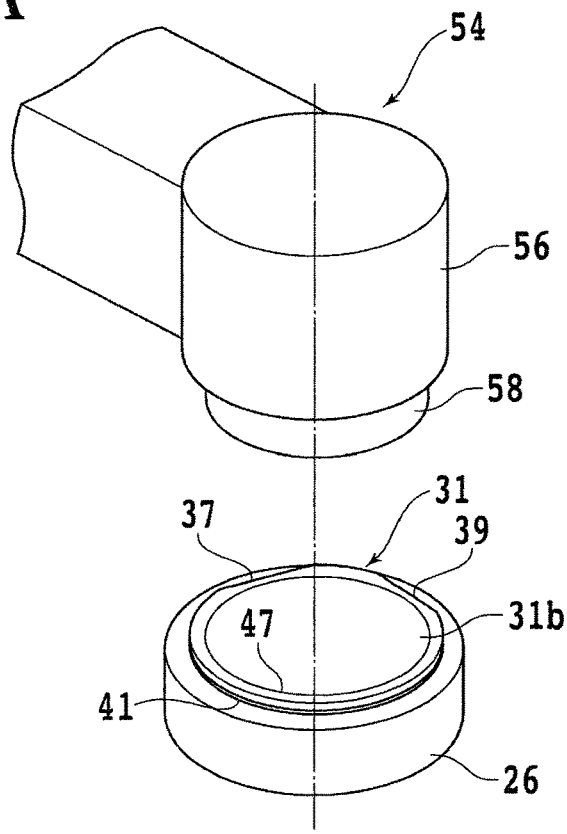
FIGS. 12A and 12B are perspective views for illustrating a wafer thinning step.
Figure 12B:
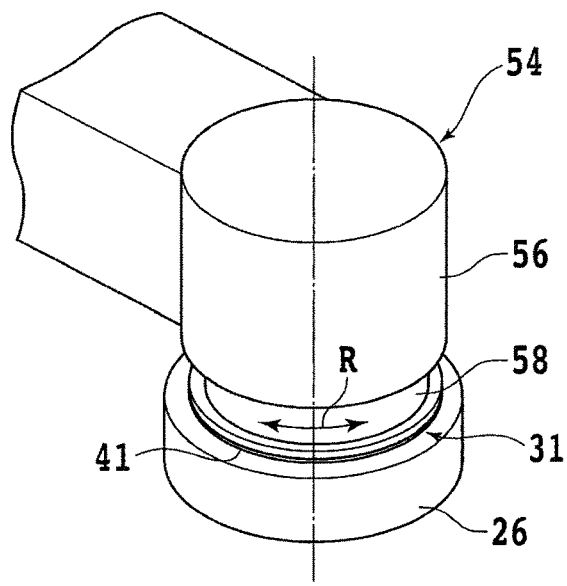

This wafer thinning step is performed by using the pressing mechanism 54 shown in FIG. 12A. The configuration of the pressing mechanism 54 is shown in FIGS. 12A and 12B. The pressing mechanism 54 includes a head 56 vertically movable by a moving mechanism (not shown) incorporated in the column 52 shown in FIG. 1 and a pressing member 58 rotatable in the direction shown by an arrow R in FIG. 12B with respect to the head 56. As shown in FIG. 12A, the pressing mechanism 54 is relatively positioned above the wafer 31 held on the chuck table 26. Thereafter, as shown in FIG. 12B, the head 56 is lowered until the pressing member 58 comes into pressure contact with the back side 31b of the wafer 31 in the central area surrounded by the annular groove 47.

In the condition where the pressing member 58 is in pressure contact with the back side 31b of the wafer 31, the pressing member 58 is rotated in the direction of the arrow R to thereby generate a torsional stress in the wafer 31. As a result, the wafer 31 is broken at the separation start point where the modified layers 43 and the cracks 45 are formed. Accordingly, as shown in FIG. 13, the wafer 31 can be separated into a first wafer 31A held on the chuck table 26 and a second wafer 31B, wherein the first wafer 31A has the front side 31a (first surface) and the second wafer 31B has the back side 31b (second surface).

Figure 13:
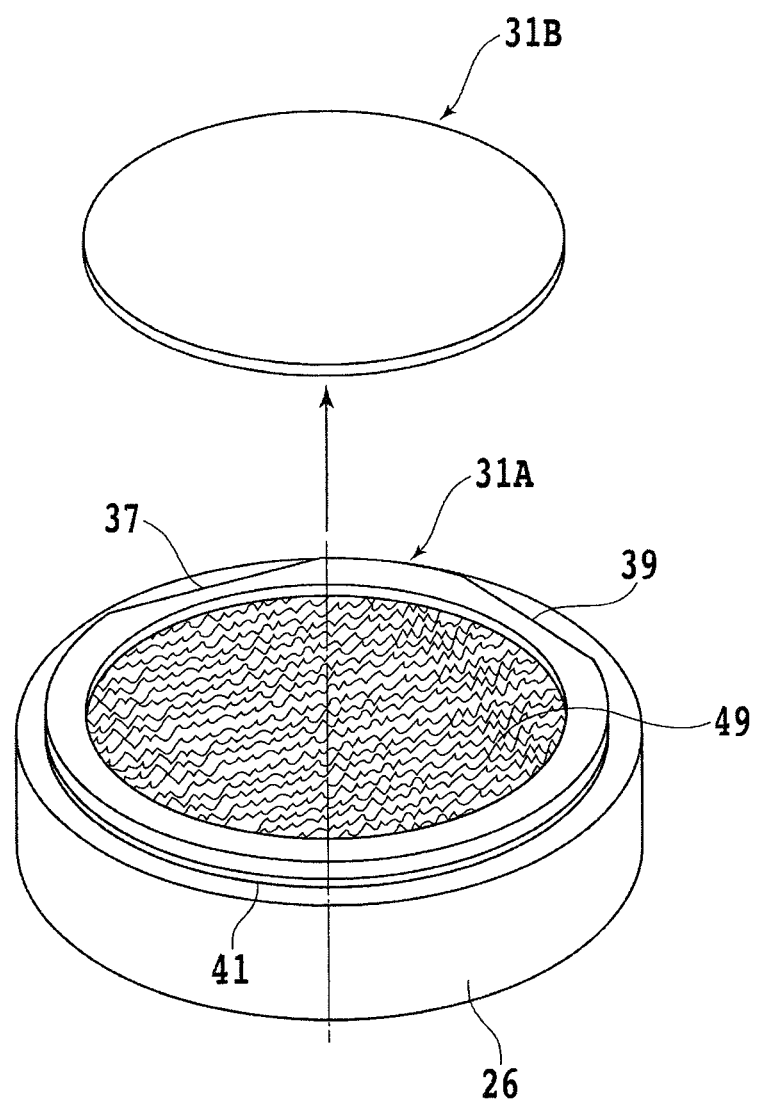
FIG. 13 is a perspective view showing a condition where the wafer has been separated into two wafers by performing the wafer thinning step.

As shown in FIG. 13, the wafer 31A held on the chuck table 26 has a separation surface 49 as the back side. The separation surface 49 is a slightly rough surface where the modified layers 43 and the cracks 45 are partially left. That is, microscopic asperities are formed on the separation surface 49. Accordingly, it is preferable to perform a grinding step of grinding the separation surface 49 as the back side of the wafer 31A to thereby flatten the separation surface 49.

Figure 14:
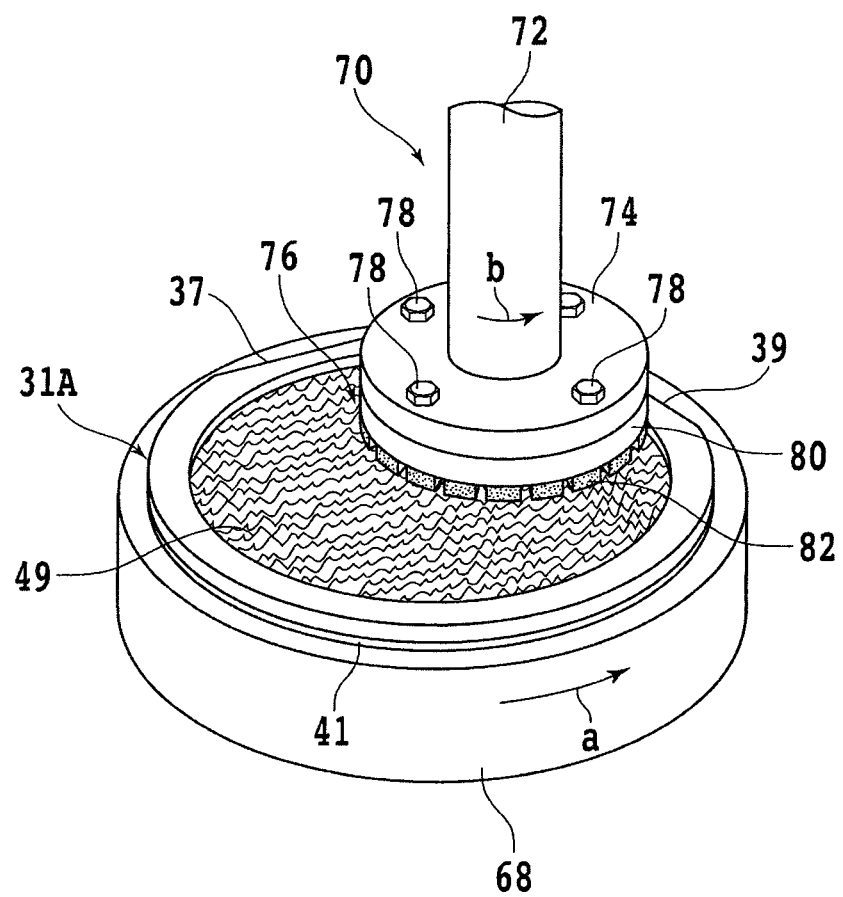
FIG. 14 is a perspective view showing a grinding step of grinding the back side of the thinned wafer to thereby flatten the back side thereof.

In performing the grinding step, the wafer 31A is held under suction through the protective tape 41 on a chuck table 68 included in a grinding apparatus (not shown) in the condition where the separation surface 49 is exposed upward as shown in FIG. 14. In FIG. 14, reference numeral 70 denotes a grinding unit included in the grinding apparatus. The grinding unit 70 includes a spindle 72 adapted to be rotationally driven by a motor (not shown), a wheel mount 74 fixed to the lower end of the spindle 72, and a grinding wheel 76 detachably mounted to the lower surface of the wheel mount 74 by a plurality of screws 78. The grinding wheel 76 is composed of an annular wheel base 80 and a plurality of abrasive members 82 fixed to the lower surface of the wheel base 80 so as to be arranged along the outer circumference thereof.

In the grinding step, the chuck table 68 is rotated at 300 rpm, for example, in the direction shown by an arrow a in FIG. 14. At the same time, the grinding wheel 76 is rotated at 6000 rpm, for example, in the direction shown by an arrow b in FIG. 14. Further, a grinding unit feeding mechanism (not shown) is driven to lower the grinding unit 70 until the abrasive members 82 of the grinding wheel 76 come into contact with the separation surface 49 of the wafer 31A held on the chuck table 68. Then, the grinding wheel 76 is fed downward by a predetermined amount at a predetermined feed speed (e.g., 0.1 µm/second), thereby grinding the separation surface 49 of the wafer 31A to flatten the separation surface 49. As a result, the modified layers 43 and the cracks 45 left on the separation surface 49 of the wafer 31A can be removed to obtain a flat surface as shown in FIG. 15.

In the case of grinding and flattening the back side of the wafer 31A obtained by the wafer thinning step mentioned above, it is only necessary to slightly grind the back side of the wafer 31A by an amount of approximately 1 µm to 5 µm, so that the wear amount of the abrasive members 82 can be suppressed to approximately 4 µm to 25 µm. As shown in FIG. 15, a circular recess 51 is formed on the back side of the wafer 31A in the central area corresponding to the device area 35a by performing the wafer thinning step, and the circular recess 51 has a bottom surface 51a ground to be flattened by the grinding step.

Figure 15:
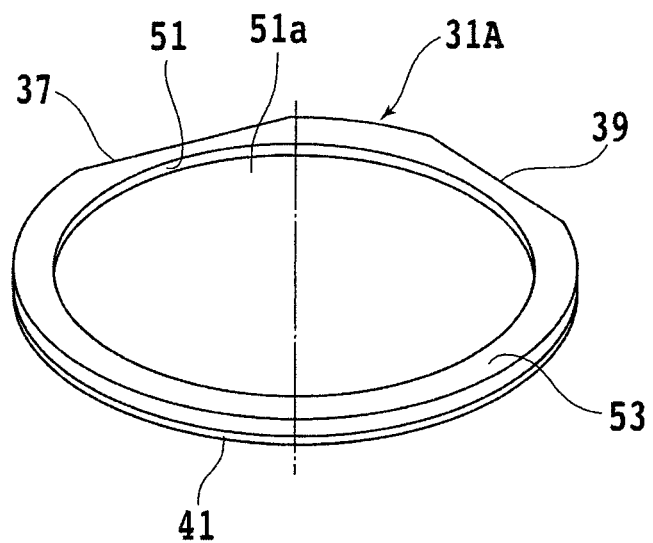
FIG. 15 is a perspective view of the wafer flattened by the grinding step as viewed from the back side of the wafer.

The back side of the wafer 31A in a peripheral area corresponding to the peripheral marginal area 31c is left to form a ring-shaped reinforcing portion 53 as shown in FIG. 15, thereby preventing damage to the wafer 31A and facilitating the handling of the wafer 31A. Further, the wafer 31B separated from the wafer 31A in FIG. 13 can be reused as an SiC substrate, thereby achieving great economy.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer thinning method for thinning a wafer to a finished thickness formed from an SiC substrate having a first surface, a second surface opposite to said first surface, a c-axis extending from said first surface to said second surface, and a c-plane perpendicular to said c-axis, said first surface of said SiC substrate having a device area where a plurality of devices are formed and a peripheral marginal area surrounding said device area, said wafer thinning method comprising:
   providing a wafer formed from an SiC substrate having a first surface, a second surface opposite to said first surface, a c-axis extending from said first surface to said second surface, and a c-plane perpendicular to said c-axis, where said c-plane is set in the SiC substrate at the molecular level, where said c-axis is inclined by an off angle with respect to a normal to said first surface, where said c-axis and said normal to the first surface intersect each other, and thereby said c-plane is inclined by said off angle with respect to the first surface, and said first surface of said SiC substrate having a device area where a plurality of devices are formed and a peripheral marginal area surrounding said device area;
   an annular groove forming step of forming an annular groove on said second surface of said SiC substrate in an annular area corresponding to the boundary between said device area and said peripheral marginal area in a condition where a thickness corresponding to the finished thickness is left;
   a separation start point forming step of setting the focal point of a laser beam having a transmission wavelength to said SiC substrate inside said SiC substrate in a central area surrounded by said annular groove at a predetermined depth from said second surface, which depth corresponds to the finished thickness, and next applying said laser beam to said second surface while relatively moving said focal point and said SiC substrate to thereby form a modified layer inside said SiC substrate at said predetermined depth in said central area and also form cracks extending from said modified layer along said c-plane, thus forming a separation start point; and
   a wafer thinning step of applying an external force to said wafer after performing said separation start point forming step, thereby separating said wafer at said separation start point into a first wafer of the finished thickness and having said first surface of said SiC substrate and a second wafer having said second surface of said SiC substrate, and wherein a ring-shaped reinforcing portion is formed on a back side of said first wafer in a peripheral area corresponding to said peripheral marginal area;
   said separation start point forming step including:
      a modified layer forming step of relatively moving the focal point of said laser beam in a first direction, where the first direction is perpendicular to a second direction, and further wherein said second direction is defined as a direction parallel to a line connecting a point where said c-axis intersects said first surface to a to a point where said normal intersects said first surface, thereby linearly forming said modified layer extending in said first direction, and
      an indexing step of relatively moving said focal point in said second direction to thereby index said focal point by a predetermined amount.

2. The wafer thinning method according to claim 1, further comprising:
   a grinding step of grinding the back side of said first wafer having said first surface except said ring-shaped reinforcing portion after performing said wafer thinning step, thereby flattening the back side of said first wafer except said ring-shaped reinforcing portion.

3. The wafer thinning method according to claim 1, wherein said external force of said wafer thinning step comprises applying a torsional stress to said wafer.

4. The wafer thinning method according to claim 2, wherein said external force of said wafer thinning step comprises applying a torsional stress to said wafer.

* * * * *

UNITED STATES PATENT AND TRADEMARK OFFICE
CERTIFICATE OF CORRECTION

PATENT NO. : 10,319,593 B2
APPLICATION NO. : 15/209292
DATED : June 11, 2019
INVENTOR(S) : Hirata et al.

Page 1 of 1

It is certified that error appears in the above-identified patent and that said Letters Patent is hereby corrected as shown below:

In the Claims

Column 10, Line 43, delete the first instance of the duplicate phrase "to a".

Signed and Sealed this
Eighteenth Day of August, 2020

Andrei Iancu
*Director of the United States Patent and Trademark Office*